United States Patent [19]

Koyama

[11] Patent Number: 4,841,173
[45] Date of Patent: Jun. 20, 1989

[54] BIPOLAR LOGIC CIRCUIT
[75] Inventor: Tsunehiro Koyama, Itami, Japan
[73] Assignee: Mitsubishi Denki Kabushiki Kaisha, Japan
[21] Appl. No.: 81,227
[22] Filed: Aug. 4, 1987
[30] Foreign Application Priority Data Aug. 7, 1986 [JP] Japan .................................. 61-186649

[51] Int. Cl.$^4$ ...................... H03K 19/088; H03K 5/08; H03K 17/687
[52] U.S. Cl. .................................. 307/456; 307/443; 307/458; 307/557; 307/561; 307/573
[58] Field of Search ............... 307/443, 454, 456, 458, 307/557, 561, 573

[56] References Cited

FOREIGN PATENT DOCUMENTS 0189564  8/1986  European Pat. Off. ............. 307/456
0099824  6/1982  Japan .................................. 307/456
0019032  2/1983  Japan .................................. 307/456

OTHER PUBLICATIONS

Mitsubishi LSTTLs M74LS245P.

Primary Examiner—John Zazworsky
Assistant Examiner—Margaret R. Wambach
Attorney, Agent, or Firm—Leydig, Voit & Mayer

[57] ABSTRACT

In a bipolar logic circuit, an ouptut Darlington transistor and a first transistor are connected in series between a high potential source and a low potential source. A second transistor has a collector connected to a base of the output Darlington transistor and to the high potential source through a resistor, an emitter connected to a base of the first transistor, and a base connected to the high potential source through a resistor. A third transistor has an emitter connected to the low potential source and a base supplied with a signal corresponding to an input signal. A first diode has an anode connected to the base of the second transistor and a cathode connected to a collector of the third transistor. The bipolar logic circuit comprises a second diode whose anode is connected to the emitter of the second transistor and whose cathode is connected to the collector of the third transistor to provide a discharge path for base charges of the first transistor and to lessen transient current of the first transistor. The discharge path improves the high speed performance of the bipolar logic circuit and reduces transient current.

2 Claims, 4 Drawing Sheets

BIPOLAR LOGIC CIRCUIT

BACKGROUND OF THE INVENTION

This invention relates to a bipolar logic circuit, and more particularly to improvements in a circuit which serves to discharge charges stored in the base of an output transistor when an output changes from "L" (a low level) to "" (a high level).

FIG. 5 illustrates a single-input buffer circuit having a base charge-discharging circuit which is shown in, for example, '85 MITSUBISHI SEMICONDUCTORS, BIPOLAR DIGITAL IC <LSTTL>. Referring to the figure, numeral 1 designates an NPN-type SBD (Schottky barrier diode) clamped transistor, and numerals 2 and 3 designate resistors set at predetermined resistances. A base charge-discharging circuit is constructed of the transistor 1 and the resistors 2, 3. Numeral 4 designates an input terminal, and numeral 5 an input PNP-transistor the base of which is connected to the input terminal 4. Shown at numerals 6, 7, 8, 12, 13 and 15 are NPN-type SBD clamped transistors. Numeral 16 designates an NPN-transistor, and this transistor and the transistor 15 are Darlington-connected to construct an output Darlington Transistor. The output Darlington transistor and the transistor 13 are connected in series between a high potential source terminal 11 and a low potential source terminal 17. In addition, the emitter of the transistor 12 is connected to the base of the transistor 13 at a node, and the base charge-discharging circuit stated above is connected between the node of the transistors 12 and 13 and the low potential source terminal 17. Besides, the base of the transistor 12 is connected to the high potential source terminal 11 through a resistor 10. Numerals 9, 18, 19, 20 and 21 denote Schottky barrier diodes (SBD's). The anode of the SED 9 is connected to the base of the transistor 12, and has its cathode connected to the collector of the transistor 8. Numeral 14 indicates an output terminal, and numerals 22–28 indicate resistors.

Next, the operation of the prior-art circuit will be described.

In a case where an "H" (high) voltage has been applied to the input terminal 4, the input PNP-transistor 5 turns "OFF", the transistors 6, 7 and 8 turn "ON," the transistor 12 turns "OFF," and the output Darlington transistor 15, 16 turns "ON," so that the output terminal 14 becomes an "H" voltage.

In a case where an "L" (low) voltage has been applied to the input terminal 4, the input PNP-transistor 5 turns "ON," the transistors 6, 7 and 8 turn "OFF," and the transistors 12 and 13 turn "ON," so that the output terminal 14 becomes an "L" voltage. Besides, in a case where the voltage applied to the input terminal 4 has changed from "L" to "H", also the level of the output terminal 14 changes from "L" to "H". Under such a state, the transistor 1 forms a discharge path for charges stored in the base of the transistor 13, to shorten the turn-off time of the transistor 13 and to reduce the transient current thereof.

The prior-art bipolar logic circuit is constructed and operatred as described above, and the transistor 13 turns "OFF" after the transistor 12 has turned "OFF". Accordingly, there have been the problems that the circuit has an undesirably slow high-speed performance and a transient current flows through the circuit.

SUMMARY OF THE INVENTION

This invention has been made in order to eliminate the problem mentioned above. An object of the invention is to provide a bipolar logic circuit which exhibits a favorable high-speed performance and through which only a small transient current flows.

The bipolar logic circuit according to this invention comprises a diode interposed between the base of a first transistor and the collector of a third transistor so that a discharge path for charges stored in the base of the first transistor may be formed by the third transistor.

In the bipolar logic circuit of this invention, the diode is interposed between the base of the first transistor and the collector of the third transistor, so that when the third transistor is turned on, base charges of the first transistor are discharged, and the first transistor is turned "OFF". Thus, the high-speed performance can be improved, and the treatment current can be reduced.

BRIEF DESCRIPTION OF THE DRAWINGS

Throughout the drawings, the same symbols indicate identical or equivalent portions.

DESCRIPTION OF THE PREFERRED EMBODIMENTS

Now, embodiments of this invention will be described with reference to the drawings.

Figure 1:
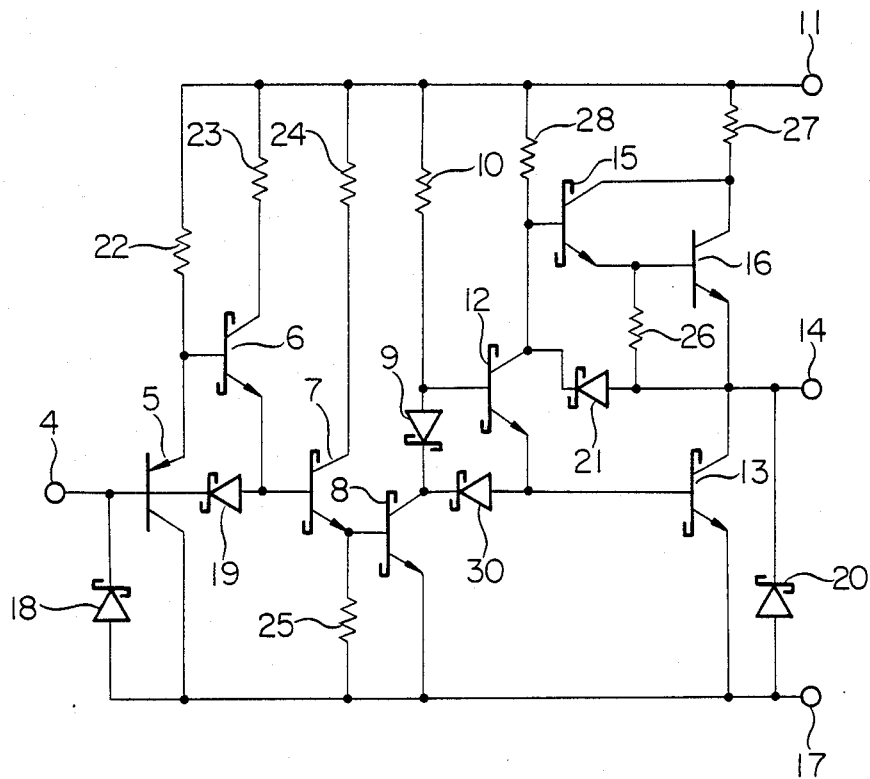
FIG. 1 is a circuit diagram showing a bipolar logic circuit according to an embodiment of this invention.
Figure 5:
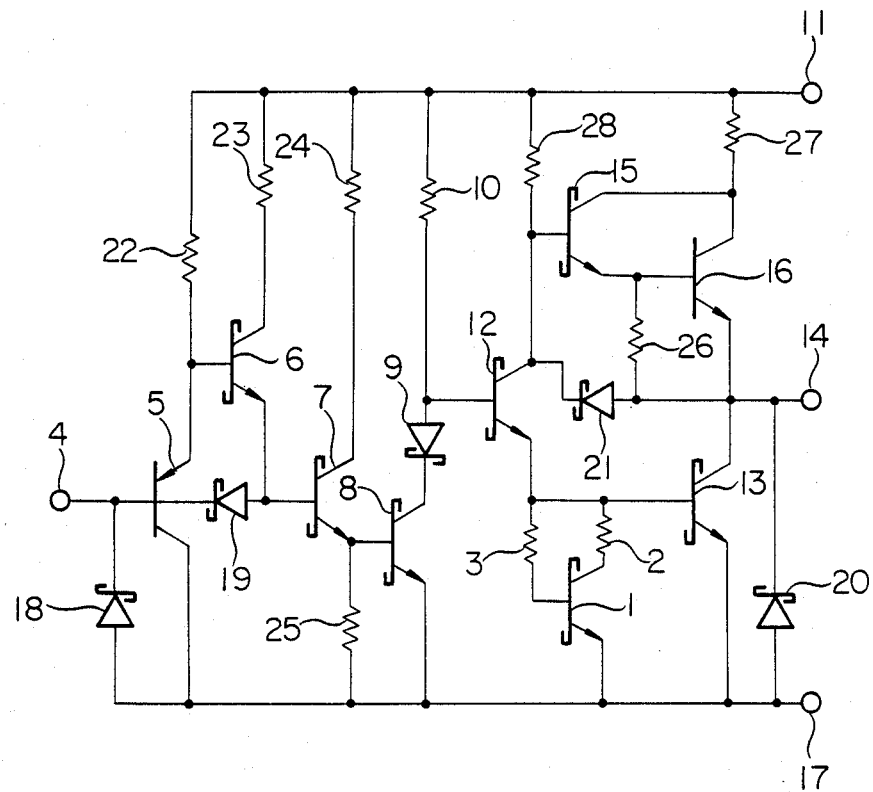
FIG. 5 is a circuit diagram showing a bipolar logic circuit in a prior art.

FIG. 1 shows a bipolar logic circuit according to one embodiment of this invention, in which the same numerals as in FIG. 5 indicate identical components. Numeral 30 denotes a Schottky barrier diode which has its anode connected to the emitter of the transmitter 12 and its cathode connected to the collector of the transistor 8.

The circuit thus constructed, operates in a state in which a steady "H" or "L" level is applied to the input terminal 4 in a manner similar to that of the prior-art example. In a transient state in which the voltage on the output terminal 14 changes from "L" to "H," when the transistor 8 turns "ON," the diode 30 forms a discharge path in which charges stored in the base of the transistor 13 are discharged through this diode 30 and the transistor 8. Thus, it is possible to make the turn-off time of the transistor 13 shorter and to lessen the transient current of the transistor 13.

Figure 4:
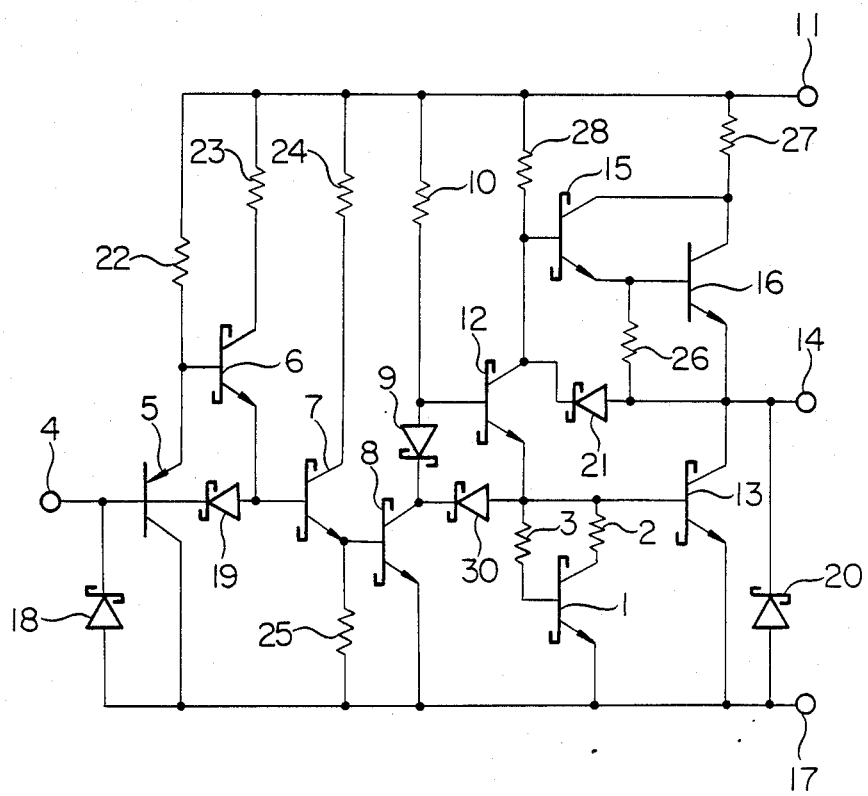
FIG. 4 is a circuit diagram showing a bipolar logic circuit according to another embodiment of this invention.

FIG. 4 shows a bipolar logic circuit according to another embodiment of this invention. The circuit of the present embodiment includes both the diode 30 of the preceding embodiment and the transistor 1 and resistors 2, 3 of the prior-art example conjointly used as the base charge-discharging circuit. Thus, more favorable effects than with the preceding embodiment can be achieved.

Figure 2:
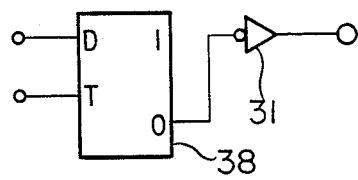
FIGS. 2 and 3 are a block diagram and a circuit diagram showing an example in which the circuit of the embodiment is applied to a flip-flop, respectively.
Figure 3:
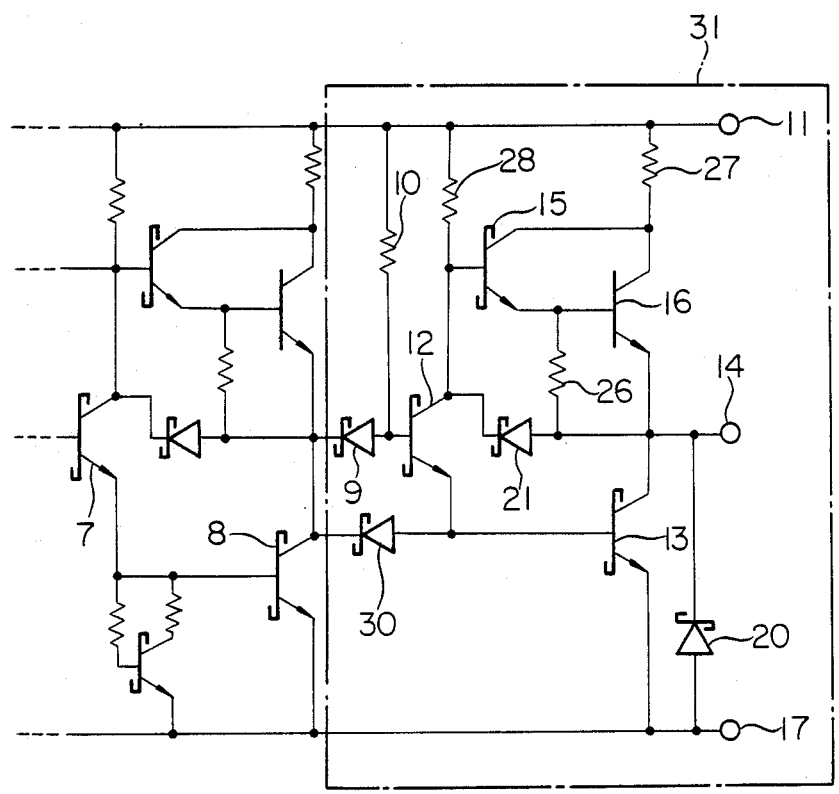

Although the illustrated embodiments are single-input buffer circuits, the present invention may well be applied to a flip-flop or counter having a buffer output. FIG. 3 shows an output equivalent circuit in a case in wihch the circuit of the present invention is employed in a flip-flop as depicted in a logic diagram in FIG. 2.

As described above, according to this invention, a diode is interposed between the base of a first transistor and the collector of a third transistor, and a discharge path for charges stored in the base of the first transistor is formed by the third transistor, so that the base charges of the first transistor can be rapidly discharged. Thus, it is possible to provide a bipolar logic circuit which has a favorable high-speed performance and through which only a small transient current flows.

What is claimed is:

1. A bipolar logic circuit comprising:
   an output Darlington transistor and a first transistor which are connected in series between a high potential source and a low potential source, the first transistor conducting transient current,
   a second transistor whose collector is connected to a base of the output Darlington transistor and is connected to the high potential source through a resistor, whose emitter is connected to a base of the first transistor, and whose base is connected to the high potential source through a resistor,
   a third transistor whose emitter is connected to the low potential source and whose base is supplied with a signal corresponding to an input signal,
   a first diode whose anode is connected to the base of the second transistor and whose cathode is connected to a collector of the third transistor; and
   a second diode whose anode is connected to said emitter of said second transistor and whose cathode is connected to said collector of said third transistor to lessen the transient current of the first transistor and turn off the first and second transistors simultaneously.

2. A bipolar logic circuit as defined in claim 1 further comprising a transistor whose base and collector are connected to a node between said emitter of said second transistor and said base of said first transistor, through respective resistors and whose emitter is connected to said low potential source to discharge charges stored in said base of said first transistor.

* * * * *